US011908351B2

United States Patent
Bi et al.

(10) Patent No.: US 11,908,351 B2
(45) Date of Patent: Feb. 20, 2024

(54) BRACKET FOR FLEXIBLE DISPLAY MODULE AND USE METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Danyang Bi, Beijing (CN); Xiaoxia Liu, Beijing (CN); Xiaoliang Fu, Beijing (CN); Haotian Yang, Beijing (CN); Kang Wang, Beijing (CN); Renzhe Xu, Beijing (CN); Wei Chen, Beijing (CN); Xiaodong Hao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 235 days.

(21) Appl. No.: 17/479,409

(22) Filed: Sep. 20, 2021

(65) Prior Publication Data

US 2022/0301462 A1    Sep. 22, 2022

(30) Foreign Application Priority Data

Mar. 16, 2021   (CN) .......................... 202110282362.4

(51) Int. Cl.
  *G09F 9/30*   (2006.01)
  *H05K 1/18*   (2006.01)

(52) U.S. Cl.
  CPC ............ *G09F 9/301* (2013.01); *H05K 1/189* (2013.01)

(58) Field of Classification Search
  CPC ................................. G09F 9/301; H05K 1/189
  (Continued)

(56) References Cited

U.S. PATENT DOCUMENTS

2011/0242448 A1   10/2011   Oohira
2019/0037694 A1*   1/2019   Koo .................. G06F 1/1652
(Continued)

FOREIGN PATENT DOCUMENTS

| CN | 103273705 A | 9/2013 |
|---|---|---|
| CN | 112114452 A | 12/2020 |
| CN | 112365806 A | 2/2021 |

OTHER PUBLICATIONS

Office Action received for Chinese Patent Application No. 202110282362.4, dated May 13, 2022, 20 pages (9 pages of English Translation and 11 pages of Office Action).

*Primary Examiner* — Binh B Tran
(74) *Attorney, Agent, or Firm* — WOMBLE BOND DICKINSON (US) LLP

(57) ABSTRACT

A bracket for a flexible display module is provided. The flexible display module includes a flexible display panel and a transparent cover plate. The flexible display panel includes a display region, a binding region opposite to the display region and a bending region connecting the display region and the binding region. The transparent cover plate is fixed to the display region of the flexible display panel. The bracket includes a first body and a second body fixedly connected with each other. An inner surface of the first body is provided with an accommodating region for accommodating the bending region of the flexible display panel. The second body is fixedly and detachably connected to a back of the flexible display panel. An orthographic projection of the flexible display panel on a surface of the transparent cover plate falls within a region where the surface of the transparent cover plate is located, and an area of the ortho- (Continued)

graphic projection of the flexible display panel on the surface of the transparent cover plate is less than an area of the surface of the transparent cover plate.

13 Claims, 3 Drawing Sheets

(58) Field of Classification Search
USPC .................................................. 361/679.01
See application file for complete search history.

(56) References Cited

U.S. PATENT DOCUMENTS

2019/0380197 A1   12/2019  Lee et al.
2020/0135063 A1*  4/2020   Jang ........................ G09F 9/301

* cited by examiner

BRACKET FOR FLEXIBLE DISPLAY MODULE AND USE METHOD THEREOF

CROSS REFERENCE TO RELATED APPLICATIONS

The present application claims the benefit of Chinese Patent Application No. 202110282362.4, filed on Mar. 16, 2021, the contents of which are incorporated herein by reference in their entireties.

TECHNICAL FIELD

This application generally relates to the field of flexible display technology, and in particular, to a bracket for a flexible display module and a use method thereof.

BACKGROUND

Nowadays, frame narrowing of flexible OLED modules has become a trend, a narrower and narrower frame makes the distance between an OLED panel and an edge of a cover plate smaller and smaller, and the possibility of the OLED panel being bumped is larger and larger in handling and assembly. To realize a compact structure of a flexible OLED panel, in general, the non-display region of the flexible OLED panel is bent (folded) towards the back side of the display panel (i.e., a side opposite to the display surface), and in such a bending structure of the OLED panel, the most fragile part is usually the bending region of the panel. Therefore it is especially important to adopt protection measures for the bending region.

SUMMARY

This application provides a bracket for a flexible display module, wherein the flexible display module includes a flexible display panel and a transparent cover plate, the flexible display panel includes a display region, a binding region opposite to the display region and a bending region connecting the display region and the binding region, and the transparent cover plate is fixed to the display region of the flexible display panel, wherein the bracket includes a first body and a second body fixedly connected with each other, the inner surface of the first body is provided with an accommodating region for accommodating the bending region of the flexible display panel, and the second body is fixedly and detachably connected to a back of the flexible display panel, and wherein the orthographic projection of the flexible display panel on the surface of the transparent cover plate falls within a region where the surface of the transparent cover plate is located, and the area of the orthographic projection of the flexible display panel on the surface of the cover plate is less than the area of the surface of the transparent cover plate.

According to an aspect of the disclosure, the binding region is provided with a drive chip and a flexible circuit board, and the accommodating region covers at least the drive chip.

According to an aspect of the disclosure, the first body includes a vertical wall and a transverse wall fixedly connected with each other, the vertical wall as a whole extends along the normal direction of the display region and is used for supporting the entire bracket, and the transverse wall as a whole extends along a direction parallel to the display region and is configured to be joined with the second body; and the second body includes a press component and a connecting arm fixedly connected with each other, the connecting arm is L-shaped as a whole and includes a transverse arm portion and a vertical arm portion, one end of the transverse arm portion is fixedly connected with the transverse wall and the other end of the transverse arm portion is connected with the vertical arm portion, one end of the vertical arm portion is connected with the transverse arm portion and the other end of the vertical arm portion is fixedly connected with the press component, and the press component is configured to press the back of the flexible display panel.

According to an aspect of the disclosure, the orthographic projection of the transverse wall on the flexible display panel covers at least the drive chip, and the bottom surface of the press component is configured to be capable of pressing at least one of the flexible circuit board or the flexible display panel.

According to an aspect of the disclosure, a release film is provided between the press component and the flexible display module, the release film is a double-sided adhesive tape, one side of the double-sided adhesive tape has weak adhesive for removably fixing with the flexible display module, and the other side of the double-sided adhesive tape has strong adhesive for removably fixing with the press component.

According to an aspect of the disclosure, the area of the release film covers at least the bottom surface of the press component, and the release film is provided with a release head.

According to an aspect of the disclosure, the connection region of the release head and the release film is adjacent to the bending region, and the release head extends from the connection region in a direction away from the bending region.

According to an aspect of the disclosure, a buffering member is further provided between the press component and the release film, and the buffering member is fixedly connected with the release film and the press component by means of adhesion.

According to an aspect of the disclosure, the bottom surface of the vertical wall is configured to protrude beyond the bottom surface of the transparent cover plate.

According to an aspect of the disclosure, a contour shape of the inner surface of the vertical wall conforms to a contour shape of the outer edge of the cover plate of the flexible display module.

According to an aspect of the disclosure, at least one limiting rib is provided at the first body adjacent to the accommodating region, the bottom height of the limiting rib is higher than the height of the bottom surface of the vertical wall, the limiting rib is a slope-shaped structure and extends from the inner surface of the vertical wall to the transverse wall, and the width of the limiting rib increases gradually from the inner surface of the vertical wall to the transverse wall.

This application further provides a use method of a bracket for a flexible display module, wherein the flexible display module includes a flexible display panel and a transparent cover plate, the flexible display panel includes a display region, a binding region opposite to the display region and a bending region connecting the display region and the binding region, and the transparent cover plate is fixed to the display region of the flexible display panel, wherein the bracket includes a first body and a second body fixedly connected with each other, the inner surface of the first body is provided with an accommodating region for accommodating the bending region of the flexible display panel, and the second body is fixedly and detachably connected to a back of the flexible display panel, and wherein the orthographic projection of the flexible display panel on the surface of the transparent cover plate falls within a region where the surface of the transparent cover plate is located, and the area of the orthographic projection of the flexible display panel on the surface of the cover plate is less than the area of the surface of the transparent cover plate, the method includes:

fixing the bracket to the flexible display module; and removing the bracket along a direction away from the bending region of the flexible display panel.

According to a further aspect of the disclosure, the second body includes a press component and a connecting arm fixedly connected with each other, a release film is provided between the press component and the flexible display module, the release film is provided with a release head, the connection region of the release head and the release film is adjacent to the bending region, and the release head extends from the connection region in a direction away from the bending region. The removal direction of the bracket is controlled by the release head.

BRIEF DESCRIPTION OF THE DRAWINGS

Other features, objects and advantages of this application will become more apparent by reading the detailed description of non-limiting embodiments of the disclosure made with reference to the following drawings.

DETAILED DESCRIPTION

Figure 1:
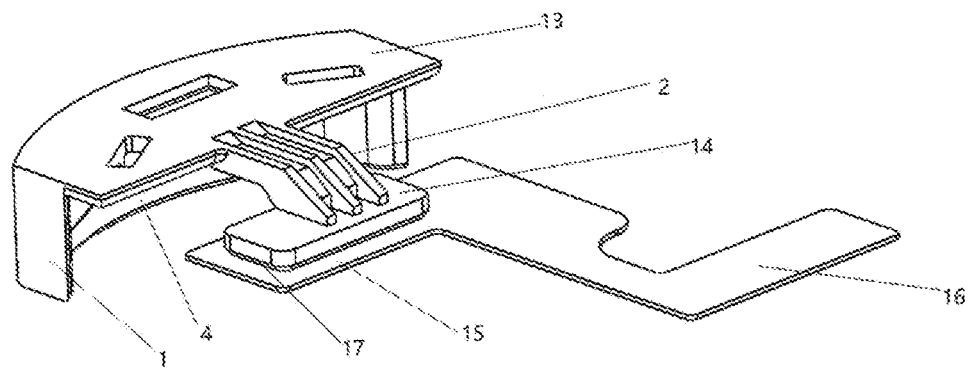
FIG. 1 is a schematic perspective view of a bracket for a flexible display module provided by some exemplary embodiments of this application.
Figure 2:
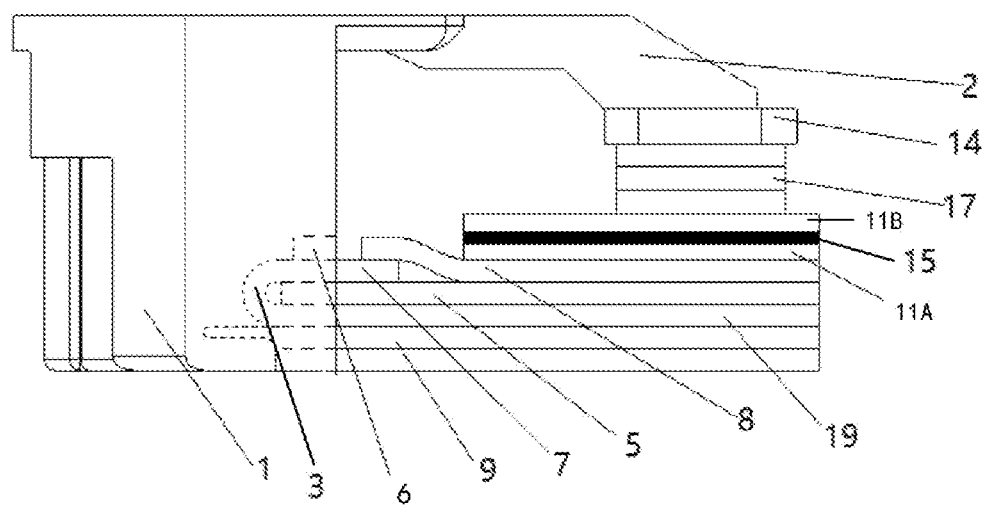
FIG. 2 is a schematic cross-sectional view of a bracket for a flexible display module provided by some exemplary embodiments of this application when installed on the flexible display module.
Figure 3:
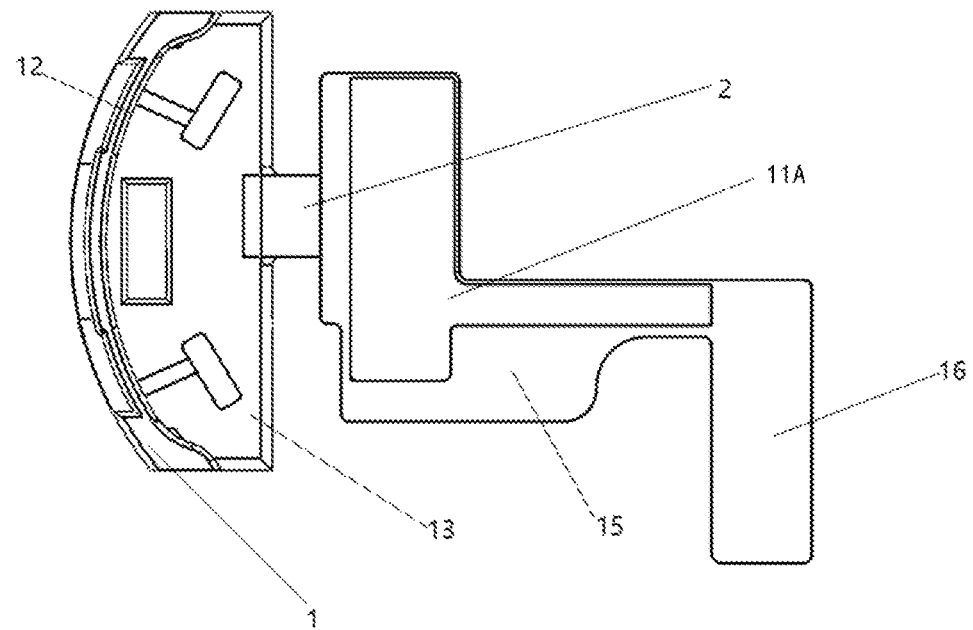
FIG. 3 is a bottom view of a bracket for a flexible display module provided by some exemplary embodiments of this application.

In the following, this application will be further described in detail in connection with the drawings and embodiments. It can be understood that the specific embodiments described herein are only used to elucidate the disclosure, and not to limit the protection scope of the disclosure. In addition, it needs to be further noted that, for convenience of description, only the parts related to the disclosure are shown in the drawings.

It needs to be noted that the embodiments in this application and the features in the embodiments can be combined with each other without conflict. Hereinafter, this application will be described in detail with reference to the drawings and in conjunction with the embodiments.

In the following, a flexible OLED display is taken as an example to briefly introduce a fabrication process of a flexible display panel of the disclosure. A fabrication process of a flexible OLED display panel roughly includes the following steps: fabricating an OLED device on a flexible substrate, then performing a thin film packaging process for the OLED device, and pasting a front protective film and a back protective film (back film for short hereinafter). It needs to be noted that the azimuth terms "front" and "back" herein are a relative concept, and not an absolute concept. For the convenience of description, in this application, a side facing towards the display surface is called a front side, and a side facing away from the display surface is called a back side.

A flexible OLED display panel may be divided into a display region for displaying an image and a non-display region for attaching other functional modules such as a drive circuit according to the function. To realize a narrow frame, the non-display region of the flexible panel may be bent (folded) towards the back side of the display panel (that is, a side opposite to the forward display region of the display panel). Then, other functional modules are assembled on the non-display region, for example, the drive circuit module is bound, or the like. Therefore, in general, the non-display region of the flexible OLED display panel which is bent to the back side is also called a binding region.

After bending the flexible display panel, first, a transparent cover plate (e.g., a glass cover plate) is pasted by an optical clear adhesive (OCA) to the forward display region of the flexible display panel, to form a flexible display module; then, the flexible display module (including the flexible display panel and the cover plate) is arranged onto a bracket according to the disclosure, to facilitate transportation and storage of the flexible display module.

It needs to be noted that, in general, the region of the cover plate extending along a horizontal plane is greater than that of the flexible display panel extending along the horizontal plane. In other words, the orthographic projection of the flexible display panel on the surface of the cover plate falls within a region where the surface of the cover plate is located, and the area of the orthographic projection of the flexible display panel on the surface of the cover plate is less than the area of the surface of the cover plate. As such, it can better achieve effective protection of the flexible display panel by the cover plate.

With reference to FIGS. 1-4, an aspect of this application provides a bracket for a flexible display module, wherein the flexible display module includes a flexible display panel 3, 7, 19 and a transparent cover plate 9. The flexible display panel 3, 7, 19 includes a forward display region (display region for short hereinafter) 19, a back binding region (binding region for short hereinafter) 7 opposite to the display region 19 and a bending region 3 connecting the display region 19 and the binding region 7. The bracket includes a first body 1, 13 and a second body 2, 14 fixedly connected with each other.

The first body 1, 13 includes a vertical wall 1 and a transverse wall 13 fixedly connected with each other. The vertical wall 1 of the first body 1, 13 overall extends along the normal direction of the display region and is used for supporting the entire bracket. The transverse wall 13 of the first body 1, 13 overall extends along a direction parallel to the display region and is configured to be joined with the second body 2, 14. The vertical wall 1 of the first body 1, 13 is provided with an accommodating region 4, and the accommodating region 4 is configured to accommodate the bending region 3 of the flexible display panel for protecting the bending region 3 from extrusion and collision. For example, the accommodating region 4 may be configured to include a groove or a flange protruding from the vertical wall 1 along a direction parallel to the display region 19.

The second body 2, 14 includes a press component 14 and a connecting arm 2 fixedly connected with each other. The connecting arm 2 of the second body 2, 14 is L-shaped as a whole and includes a transverse arm portion and a vertical arm portion. One end of the transverse arm portion is fixedly connected with the transverse wall 13 of the first body 1, 13 and the other end of the transverse arm portion is connected with the vertical arm portion. One end of the vertical arm portion is connected with the transverse arm portion and the other end of the vertical arm portion is fixedly connected with the press component 14. The press component 14 is configured to press the back of the flexible display panel, and thereby make the entire flexible display module stable, so as to facilitate transportation and storage. For example, the press component 14 may be detachably adhered to a back of the flexible display panel. It needs to be noted that, the thickness and shape of the structures of individual layers in FIG. 2 and FIG. 6 do not reflect the real condition, and the goal is just to schematically illustrate the technical solution of the disclosure.

The implementation of a narrow frame scheme of the display panel is achieved mainly by bending the binding region 7 towards the back side of the display panel, and accordingly, a drive chip 6 is also arranged on the back of the display module. In specific settings, the flexible display panel 3, 7, 19 includes the display region 19, the bending region 3 located at one side of the display region 19, and the binding region 7 facing away from the display region 19. The binding region 7 is provided with the drive chip 6 and a flexible circuit board 8, and the accommodating region 4 further accommodates at least the drive chip 6 to protect the drive chip 6.

In addition, foam material 5 and a reinforcing plate are attached to the back of the display region 19 (i.e., a side facing the binding region 7). The foam material 5 may be super clean foam (SCF) produced in an environment of high cleanliness (such as ISO5, or FS100), its function is mainly to buffer and protect the flexible display panel, and it further plays the role of heat dissipation for the flexible display panel and the driver chip 6. The reinforcing plate plays the role of fixation.

It needs to be noted that, the drive chip 6 is a source drive chip 6 of the OLED panel, and of course, the drive chip 6 may also be a gate drive chip 6, and may further be an integrated chip of the source drive chip 6 and the gate drive chip 6.

It also needs to be noted that, "normal direction" refers to a direction perpendicular to the display surface of the display region 19, namely, along the thickness direction of the display region 19 of the display panel, that is, a direction from the display region 19 of the display panel to the transparent cover plate 9; "horizontal direction" refers to a direction parallel to the display surface of the display region 19 (i.e., the horizontal direction in FIG. 2 and FIG. 6); and "tangential direction" refers to part of horizontal directions tangent to the surface of the bending region of the display panel (i.e., a direction perpendicular to the paper in FIG. 2 and FIG. 6).

The first body 1, 13 of the bracket is used to protect the bending region 3 and the drive chip 6, and the bottom surface of the vertical wall 1 is aligned with the bottom surface of the transparent cover plate 9 or slightly protrudes beyond the bottom surface of the transparent cover plate 9. In specific settings, the bottom surface of the vertical wall 1 may protrude beyond the bottom surface of the transparent cover plate 9 by 0-3 mm, that is, the bottom height of the transparent cover plate 9 is 0-3 mm higher than the bottom height of the vertical wall 1 in FIG. 2 and FIG. 6. The extension range of the side surface of the vertical wall 1 is aligned with the extension range of the bottom surface of the transparent cover plate 9 or slightly exceeds the extension range of the bottom surface of the transparent cover plate 9, such that bump of the OLED panel may be prevented.

A release film 15 is provided between the press component 14 and the flexible display module 3, 7, 19, 9. The release film 15 may be a double-sided adhesive tape, one side of the double-sided adhesive tape has weak adhesive 11A for removably fixing with the flexible display module, and the other side of the double-sided adhesive tape has strong adhesive 11B for removably fixing with the press component 14. It needs to be noted that weak adhesive and strong adhesive refer to the amount of the release force of the adhesive, and the release force per unit area of the weak adhesive is less than the release force per unit area of the strong adhesive.

It needs to be noticed that the higher the overall height of the first body 1, 13 is, the larger the pulling force on the display panel in the display module is after the bracket is fixed to the display module, and the overall height of the first body 1, 13 may be adjusted according to the amount of the release force of the weak adhesive 11A on the release film 15. For example, when the release force of the weak adhesive 11A is too big and not conducive to removal of the display panel, the overall height of the first body 1, 13 may be suitably raised to facilitate removal of the display panel.

The contour shape of the inner surface 12 of the vertical wall 1 forming the accommodating region 4 conforms to the contour shape of the outer edge of the cover plate 9 of the flexible display module, that is, profiling design (that is, the shapes of the two are consistent). By the profiling design, on one hand, it may be prevented that the profiled inner surface 12 contacts the cover plate 9 when tangential displacement occurs to the panel during handling or transportation, thereby preventing the bending region 3 from being collided, and on the other hand, the chance of the bending region 3 being collided may be reduced during the bracket is fixed with the display panel or during the removal of the bracket.

The orthographic projection of the transverse wall 13 on the flexible display panel covers at least the drive chip 6 to protect the drive chip 6 from the top. The bottom surface of the press component 14 may be configured to be pressed on or adhered to at least one of the flexible circuit board 8, the flexible display panel 3, 7, 19 or the foam material 5.

One side of the display panel facing the cover plate 9 is the display surface (front surface), and one side facing away from the cover plate 9 is the back. The press component 14 is removably attached to the back of the display panel. The bottom surface of the second body 2, 14 faces towards the cover plate 9. What is shown in FIG. 5(a) is a state before tangential displacement occurs, and what is shown in FIG. 5(b) is a state after the tangential displacement occurs. It can be seen from FIG. 5(a) and FIG. 5(b) that when the flexible display module moves along the tangential direction of the bracket, there is a risk that the bending region 3 is collided by the inner surface 12 of the vertical wall 1. However, since the extension region of the cover plate 9 is greater than the extension region of the flexible display panel 3, 7, 19, and when the flexible display module moves along the tangential direction of the bracket, it will first touch the cover plate 9, and hence tangential collision of the bending region 3 is effectively avoided.

Figure 4:
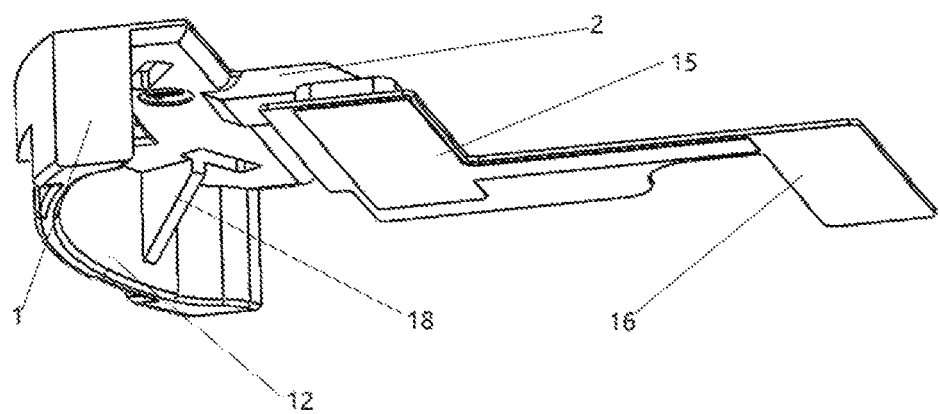
FIG. 4 is a schematic perspective view of a bracket for a flexible display module provided by some exemplary embodiments of this application, which schematically shows a structure of a limiting rib.
Figure 6:
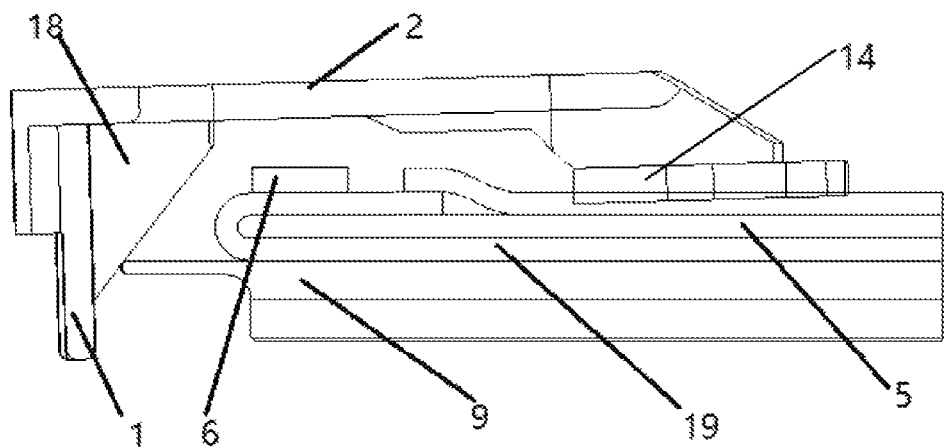
FIG. 6 schematically shows a situation in which a normal movement occurs to a bracket provided by some exemplary embodiments of this application.

When the bracket moves along the normal direction, especially, the bracket comes off accidentally, as shown in FIG. 6, there is also a risk that the bending region 3 is subject to collision of the inner surface 12 of the vertical wall 1 or the transverse wall 13. In this connection, the inventors of the disclosure perform further improvement on the bracket. In particular, one or more limiting rib 18 is provided at the first body 1, 13 adjacent to the accommodating region 4. As shown in FIG. 4 and FIG. 6, the bottom height of the limiting rib 18 is higher than the height of the bottom surface of the vertical wall 1. The limiting rib 18 is a wedge-shaped structure (or a slope-shaped structure) and extends from the inner surface 12 of the vertical wall 1 to the transverse wall 13, and the extension range (the slope width) of the limiting rib 18 increases gradually from the inner surface 12 of the vertical wall 1 to the transverse wall 13. When the bracket moves in the normal direction, especially comes off, the limiting rib 18 first contacts the outer edge of the cover plate 9, which therefore effectively avoids collision of the bending region 3 in the normal direction. By provision of the limiting rib 18, in addition to reinforcement of the strength of the first body 1, 13, when normal movement occurs to the bracket, the limiting rib 18 of the bracket first interferes with the cover plate and prevents the bracket from bumping the bending region 3. The shape of the limiting rib 18 is a gradually changing slope-shaped structure, and when the bracket moves downwards gradually, the distance between the limiting rib 18 and the cover plate 9 also decreases gradually and then they contact, thereby preventing the bracket from further moving downwards. The limiting rib 18 may provide a contact force between the bracket and the cover plate 9, forms a stable space between the bracket and the cover plate 9, continues protecting the bending region 3, and further prevents the bracket from bumping the bending region 3.

The area of the release film 15 covers at least the bottom surface of the press component 14, and the release film 15 is provided with a release head, to facilitate removal of the bracket. It may also reduce the tearing force on the attached display module during the removal. In addition, it may also prevent that there is adhesive residual on the surface of the OLED module.

It needs to be noted that the adhesion position of the release film 15 may be on the flexible circuit board 8, or also on other components of the flexible display module. Adhesion to the flexible circuit board 8 may prevent collision or scratching of the flexible circuit board 8 during transportation or handling. To prevent the flexible circuit board 8 from being torn or pulled when the flexible display module shifts after the bracket is fixed to the flexible circuit board 8, the area of the release film 15 may be increased to cause it to cover other components of the display module around the flexible circuit board 8, to prevent damage to the flexible circuit board 8, and meanwhile, the adhesive force between the release film 15 and the display module may also be increased to prevent displacement of the flexible display module in the bracket.

The bracket for the flexible display module provided by some exemplary embodiments according to this application includes the following beneficial effect: the first body 1, 13 is provided with the accommodating region 4 to protect the bending region 3 of the display panel, protect the bending region in various directions when movement of the bracket in the normal direction, the tangential direction and the horizontal direction takes place, and prevent collision of the bracket and the bending region.

In another aspect, this application further provides a use method of a bracket for a flexible display module, including:

fixing the bracket for the flexible display module as described above to the flexible display module; and removing the bracket, the removal direction being away from the bending region 3 of the flexible display panel 3, 7, 19.

In practice, the removal direction of the bracket may be controlled by the release head 16. In particular, the removal direction of the bracket may be controlled by suitably setting the connection region of the release head 16 and the release film 15 and the extension direction of the release head 16. For example, the connection region of the release head 16 and the release film 15 is set adjacent to the bending region 3, and the release head 16 extends from the connection region in a direction away from the bending region 3.

When installing and removing the bracket, due to the existence of the release film 15, it is conducive to reduction of indentation or scratches on the flexible display panel or module by the bracket. Especially in removing the bracket, the release head 16 of the release film 15 is held in hand to remove the bracket in a direction away from the bending region 3, to avoid collision of the bending region 3 when removing the bracket.

It needs to be noted that in embodiments of this application, the shape of the release head 16 of the release film 15 is not limited, the release head 16 may be a strip structure, a curved structure, and its extension range may exceed the area of the bottom surface of the press component 14. For the convenience of user operation, the release head 16 may be provided with a non-adhesion region, and the non-adhesion region is not provided with adhesive glue to facilitate removal. Alternatively, the provision of the non-adhesion region may be replaced with a low adhesion region, and in such a way of reducing adhesion, pulling of the flexible panel is reduced during release.

It also needs to be noted that, when manually removing the bracket, it is difficult to ensure that the bracket and the bending region 3 do not collide if there is no clear removal direction. In view of this, in embodiments of this application, collision of the bracket and the bending region 3 is avoided to the maximum extent by limiting the connection position between the release head 16 and the release film 15 or the shape and extension direction of the release head 16. In specific settings, the release head 16 may face towards one side away from the bending region 3, the connection region of the release head 16 and the release film 15 is disposed at one side adjacent to the bending region 3, and this may limit the direction of manual release and perform release towards a side away from the bending region 3. Of course, the release head 16 may face towards the left and right sides of the bending region 3, and the same principle will not be repeated here any longer.

A way of forming the non-adhesion region includes disposing an empty region, avoiding the region during printing adhesive, or forming the non-adhesion region on the adhesion region by way of covering ink.

A buffering member 17 may further be provided between the press component 14 and the release film 15, and the buffering member 17 is fixedly connected with the release film 15 and the press component 14 by means of adhesion, to further buffer and protect the flexible display module and avoid scratches or indentation on the flexible display module when installing or removing the bracket. In particular, when assembling the bracket, since adhesion needs a certain pressure, indentation on the display module may be caused. On one hand, the buffering member 17 may, have a buffering function, and is conducive to reduction of indentation when installing the bracket. On the other hand, the buffering member 17 may limit the height space margin from the press component 14 to the back of the display panel, and by increasing or decreasing the thickness of the buffering member 17, the bracket may be made to match different thickness of the display panel and have a better applicability.

In some exemplary embodiments, the buffering member 17 may be foam, and both the upper and lower surfaces of the foam are provided with strong adhesive, and fixedly connected with the bottom surface of the press component 14 and the surface of the release film 15 by way of adhesive.

Figure 5:
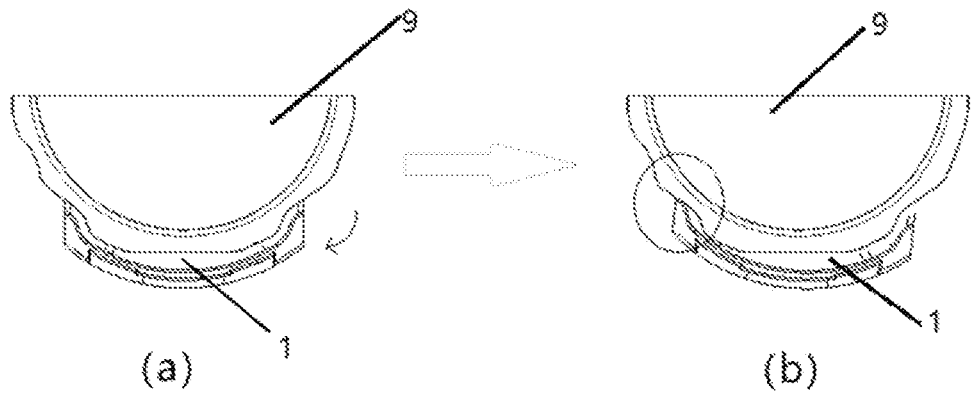
FIG. 5 schematically shows a situation in which a tangential movement occurs to a bracket for a flexible display module provided by some exemplary embodiments of this application.

During handling or transportation of the flexible display module, relative movement between the bracket and the display module may take place, and a specific situation of relative movement between the bracket and the display module includes:

when tangential movement occurs to the bracket, the profiled part of the inner surface of the vertical wall 1 of the first body 1, 13 of the bracket first touches or interferes with the cover plate 9, as shown in the mark circle in FIG. 5, to prevent the bracket from bumping the bending region 3;

when horizontal movement occurs to the bracket, the profiled part of the inner surface of the vertical wall 1 of the first body 1, 13 of the bracket first touches or interferes with the cover plate 9, as shown in FIG. 6, to prevent the bracket from bumping the bending region 3; and when normal movement occurs to the bracket, the limiting rib 18 of the bracket first interferes with the cover plate 9, to prevent the bracket from bumping the bending region 3.

In removal, the release head 16 of the release film 15 is held in hand to remove the bracket in a direction away from the bending region 3, to avoid collision of the bending region 3 when removing the bracket.

The use method of the bracket for the flexible display module provided by some exemplary embodiments according to this application may include the following beneficial effect: when removing the bracket, the removal direction is away from the bending region 3 of the flexible display panel, avoiding collision of the bending region when removing the bracket.

It needs to be noted that in the exemplary embodiments of this application, the OLED panel is taken as an example, and those applied to other display assemblies are within the protection scope of the disclosure.

It should be understood that although various features and benefits of the disclosure and specific details of the structure and function of the disclosure have been set forth in the above description, these contents are merely exemplary, and the specific details, especially the shape, size, number and arrangement of components, can be specifically changed within the scope of the principles of the disclosure to the overall scope represented by broad general meaning claimed by the claims of the disclosure.

Unless otherwise defined, all technical and scientific terms used in this disclosure have the same meanings as commonly understood by those skilled in the art to which this disclosure belongs.

Those skilled in the art will understand the term "substantially" herein (such as in "substantially all light" or in "substantially consist of"). The term "substantially" may also include embodiments having "wholly", "completely", "all", etc. Therefore, in an embodiment, adjectives are also basically removable. Where applicable, the term "substantially" may also refer to 90% or higher, such as 95% or higher, especially 99% or higher, even more particularly 99.5% or higher, including 100%. The term "including" also includes embodiments in which the term "including" means "consisting of". The term "and/or" particularly relate to one or more of those items mentioned before and after "and/or". For example, the phrase "item 1 and/or item 2" and similar phrases may refer to one or more of item 1 and item 2. The term "comprising" may mean "consisting of" in one embodiment, but may also mean "including at least the defined species and optionally one or more other species" in another embodiment.

In addition, the terms first, second, third, etc. in this specification and in the claims are used to distinguish between similar elements and do not indicate any order, quantity or importance. It should be noted that these terms so used are interchangeable under appropriate circumstances, and that the embodiments of the disclosure described herein can operate in a different order from that described or shown herein.

"Upper", "lower", "left" and "right", etc. are only used to express the relative positional relationship. When the absolute position of the described object changes, the relative positional relationship may change accordingly.

It should be noted that the above-mentioned embodiments illustrate rather than limit the disclosure, and those skilled in the art will be able to design many alternative embodiments without departing from the scope of the appended claims. In the claims, any reference marks placed between parentheses should not be interpreted as limiting the claims. The use of the verb "include" and its morphological changes does not exclude the existence of elements or steps different from those stated in the claims. The word "a" or "an" in the claims of this disclosure does not exclude the plural, which is only for convenience of description and should not be understood as limiting the protection scope of this disclosure.

The present disclosure can be realized by means of hardware including several different elements, and by means of a suitably programmed computer. In a device claim enumerating several means, several of these means can be embodied by the same hardware item. The mere fact that certain measures are recited in mutually different dependent claims does not indicate that a combination of these measures cannot be used to advantage.

The present disclosure is further applicable to devices that include one or more of the characterizing features described in this specification and/or shown in the drawings. The present disclosure further relates to a method or process including one or more of the characterizing features described in this specification and/or shown in the drawings.

The various aspects discussed in this disclosure may be combined to provide additional advantages. In addition, those skilled in the art will understand that embodiments can be combined, and more than two embodiments can also be combined. In addition, some features may form the basis of one or more divisional applications.

The invention claimed is:

1. A bracket for a flexible display module,
wherein the flexible display module comprises a flexible display panel and a transparent cover plate, the flexible display panel comprises a display region, a binding region opposite to the display region and a bending region connecting the display region and the binding region, and the transparent cover plate is fixed to the display region of the flexible display panel, wherein the bracket comprises a first body and a second body fixedly connected with each other, an inner surface of the first body is provided with an accommodating region for accommodating the bending region of the flexible display panel, and the second body is fixedly and detachably connected to a back of the flexible display panel, wherein an orthographic projection of the flexible display panel on a surface of the transparent cover plate falls within a region where the surface of the transparent cover plate is located, and an area of the orthographic projection of the flexible display panel on the surface of the cover plate is less than an area of the surface of the transparent cover plate, and wherein the first body comprises a vertical wall and a transverse wall fixedly connected with each other, the second body comprises a press component and a connecting arm fixedly connected with each other, the connecting arm is configured to connect the transverse wall with the press component, and the press component is configured to press the back of the flexible display panel.

2. The bracket for the flexible display module as claimed in claim 1, wherein the binding region is provided with a drive chip and a flexible circuit board, and the accommodating region covers at least the drive chip.

3. The bracket for the flexible display module as claimed in claim 2, wherein the vertical wall as a whole extends along a normal direction of the display region and is configured for supporting the bracket, and the transverse wall as a whole extends along a direction parallel to the display region and is configured to be joined with the second body, and wherein the connecting arm is L-shaped as a whole and comprises a transverse arm portion and a vertical arm portion, one end of the transverse arm portion is fixedly connected with the transverse wall and the other end of the transverse arm portion is connected with the vertical arm portion, one end of the vertical arm portion is connected with the transverse arm portion and the other end of the vertical arm portion is fixedly connected with the press component.

4. The bracket for the flexible display module as claimed in claim 3, wherein an orthographic projection of the transverse wall on the flexible display panel covers at least the drive chip, and a bottom surface of the press component is configured to be capable of pressing at least one of the flexible circuit board or the flexible display panel.

5. The bracket for the flexible display module as claimed in claim 4, wherein a release film is provided between the press component and the flexible display module, the release film is a double-sided adhesive tape, one side of the double-sided adhesive tape has weak adhesive for removably fixing with the flexible display module, and the other side of the double-sided adhesive tape has strong adhesive for removably fixing with the press component.

6. The bracket for the flexible display module as claimed in claim 5, wherein an area of the release film covers at least a bottom surface of the press component, and the release film is provided with a release head.

7. The bracket for the flexible display module as claimed in claim 6, wherein a connection region of the release head and the release film is adjacent to the bending region, and the release head extends from the connection region in a direction away from the bending region.

8. The bracket for the flexible display module as claimed in claim 4, wherein a buffering member is provided between the press component and the release film, and the buffering member is fixedly connected with the release film and the press component by means of adhesion.

9. The bracket for the flexible display module as claimed in claim 3, wherein a bottom surface of the vertical wall is configured to protrude beyond a bottom surface of the transparent cover plate.

10. The bracket for the flexible display module as claimed in claim 3, wherein a contour shape of an inner surface of the vertical wall conforms to a contour shape of an outer edge of the cover plate of the flexible display module.

11. The bracket for the flexible display module as claimed in claim 10, wherein at least one limiting rib is provided at the first body adjacent to the accommodating region, a bottom height of the limiting rib is higher than a height of a bottom surface of the vertical wall, the limiting rib has a slope-shaped structure and extends from the inner surface of the vertical wall to the transverse wall, and a width of the limiting rib increases gradually from the inner surface of the vertical wall to the transverse wall.

12. A use method of a bracket for a flexible display module, wherein the flexible display module comprises a flexible display panel and a transparent cover plate, the flexible display panel comprises a display region, a binding region opposite to the display region and a bending region connecting the display region and the binding region, and the transparent cover plate is fixed to the display region of the flexible display panel, wherein the bracket comprises a first body and a second body fixedly connected with each other, an inner surface of the first body is provided with an accommodating region for accommodating the bending region of the flexible display panel, and the second body is fixedly and detachably connected to a back of the flexible display panel, wherein an orthographic projection of the flexible display panel on a surface of the transparent cover plate falls within a region where a surface of the transparent cover plate is located, and an area of the orthographic projection of the flexible display panel on the surface of the transparent cover plate is less than an area of the surface of the transparent cover plate, and wherein the first body comprises a vertical wall and a transverse wall fixedly connected with each other, the second body comprises a press component and a connecting arm fixedly connected with each other, the connecting arm is configured to connect the transverse wall with the press component, and the press component is configured to press the back of the flexible display panel, the method comprising:

fixing the bracket to the flexible display module; and removing the bracket along a direction away from the bending region of the flexible display panel.

13. The use method of the bracket for the flexible display module as claimed in claim 12, wherein a release film is provided between the press component and the flexible display module, the release film is provided with a release head, a connection region of the release head and the release film is adjacent to the bending region, and the release head extends from the connection region in a direction away from the bending region, and wherein a removal direction of the bracket is controlled by the release head.

* * * * *